(12) United States Patent  (10) Patent No.: US 8,741,689 B2
Wieting  (45) Date of Patent: Jun. 3, 2014

(54) THERMAL PRE-TREATMENT PROCESS FOR SODA LIME GLASS SUBSTRATE FOR THIN FILM PHOTOVOLTAIC MATERIALS

(75) Inventor: Robert D. Wieting, San Jose, CA (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 12/569,368

(22) Filed: Sep. 29, 2009

(65) Prior Publication Data

US 2011/0020980 A1  Jan. 27, 2011

Related U.S. Application Data

(60) Provisional application No. 61/101,989, filed on Oct. 1, 2008.

(51) Int. Cl.
   *H01L 21/00* (2006.01)
(52) U.S. Cl.
   USPC .......................................................... 438/98
(58) Field of Classification Search
   USPC .......... 438/57, 74, 98; 257/E25.006; 136/243
   See application file for complete search history.

(56) References Cited

U.S. PATENT DOCUMENTS

| | | | |
|---|---|---|---|
| 3,520,732 | A | 7/1970 | Nakayama et al. |
| 3,828,722 | A | 8/1974 | Reuter et al. |
| 3,975,211 | A | 8/1976 | Shirland |
| 4,062,038 | A | 12/1977 | Cuomo et al. |
| 4,263,336 | A | 4/1981 | Thompson et al. |
| 4,332,974 | A | 6/1982 | Fraas |
| 4,335,266 | A | 6/1982 | Mickelsen et al. |
| 4,347,436 | A * | 8/1982 | Fukuda et al. ............. 250/214.1 |
| 4,441,113 | A | 4/1984 | Madan |
| 4,442,310 | A | 4/1984 | Carlson et al. |

(Continued)

FOREIGN PATENT DOCUMENTS

| | | |
|---|---|---|
| AU | 1998/78651 | 2/1999 |
| AU | 2001/40599 A1 | 8/2001 |

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

*Primary Examiner* — Fernando L Toledo
*Assistant Examiner* — Neil Prasad
(74) *Attorney, Agent, or Firm* — Kilpatrick Townsend & Stockton LLP (57) ABSTRACT

A method for fabricating a thin film solar cell includes providing a soda lime glass substrate comprising a surface region, treating the surface region with one or more cleaning process including an aqueous solution to remove one or more contaminants and/or particulates, and forming a lower electrode layer overlying the surface region. The method also includes performing a thermal treatment process to remove any residual water species to substantially less than a monolayer of water species from the lower electrode layer and soda lime glass substrate. The thermal treatment process changes a temperature of the soda lime glass substrate from a first temperature to a second temperature to pre-heat the soda lime glass substrate. Additionally, the method includes transferring the soda lime glass substrate, which has been preheated, to a deposition chamber and forming a layer of photovoltaic material overlying the lower electrode layer within the deposition chamber.

11 Claims, 6 Drawing Sheets

(56) References Cited

U.S. PATENT DOCUMENTS

| | | |
|---|---|---|
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,518,855 A | 5/1985 | Malak |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmon et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,397,401 A | 3/1995 | Toma et al. |
| 5,399,504 A | 3/1995 | Ohsawa |
| 5,436,204 A | 7/1995 | Albin et al. |
| 5,445,847 A | 8/1995 | Wada |
| 5,474,939 A | 12/1995 | Pollock et al. |
| 5,501,744 A | 3/1996 | Albright et al. |
| 5,512,107 A | 4/1996 | Van den Berg |
| 5,528,397 A | 6/1996 | Zavracy et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,726,065 A | 3/1998 | Szlufcik et al. |
| 5,738,731 A | 4/1998 | Shindo et al. |
| 5,858,819 A | 1/1999 | Miyasaka |
| 5,868,869 A | 2/1999 | Albright et al. |
| 5,948,176 A * | 9/1999 | Ramanathan et al. ........ 136/264 |
| 5,977,476 A | 11/1999 | Guha et al. |
| 5,981,868 A | 11/1999 | Kushiya et al. |
| 5,985,691 A | 11/1999 | Basol et al. |
| 6,001,744 A * | 12/1999 | Doi ............................... 438/745 |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,160,215 A | 12/2000 | Curtin |
| 6,166,319 A | 12/2000 | Matsuyama |
| 6,172,297 B1 | 1/2001 | Hezel et al. |
| 6,258,620 B1 | 7/2001 | Morel et al. |
| 6,288,325 B1 * | 9/2001 | Jansen et al. ................... 136/249 |
| 6,294,274 B1 | 9/2001 | Kawazoe et al. |
| 6,307,148 B1 | 10/2001 | Takeuchi et al. |
| 6,323,417 B1 | 11/2001 | Gillespie et al. |
| 6,328,871 B1 | 12/2001 | Ding et al. |
| RE37,512 E | 1/2002 | Szlufcik et al. |
| 6,361,718 B1 | 3/2002 | Shinmo et al. |
| 6,372,538 B1 | 4/2002 | Wendt et al. |
| 6,423,565 B1 | 7/2002 | Barth et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,442,413 B2 | 10/2008 | Zwaap et al. |
| 7,544,884 B2 | 6/2009 | Hollars |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2003/0188777 A1 | 10/2003 | Gaudiana et al. |
| 2003/0230338 A1 | 12/2003 | Menezes |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0187917 A1 | 9/2004 | Pichler |
| 2004/0191949 A1 * | 9/2004 | Iwata et al. ................... 136/256 |
| 2004/0191950 A1 * | 9/2004 | Nakamura et al. ............ 438/98 |
| 2004/0245912 A1 | 12/2004 | Thurk et al. |
| 2004/0252488 A1 | 12/2004 | Thurk |

(56) References Cited

U.S. PATENT DOCUMENTS

| | | |
|---|---|---|
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0116892 A1 | 5/2007 | Zwaap |
| 2007/0116893 A1 | 5/2007 | Zwaap |
| 2007/0151596 A1 | 7/2007 | Nasuno et al. |
| 2007/0160770 A1 | 7/2007 | Stanbery |
| 2007/0163643 A1 | 7/2007 | Van Duren et al. |
| 2007/0169810 A1 | 7/2007 | Van Duern et al. |
| 2007/0193623 A1 | 8/2007 | Krasnov |
| 2007/0209700 A1 | 9/2007 | Yonezawa et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Mishtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0280030 A1 | 11/2008 | Van Duren et al. |
| 2008/0283389 A1 | 11/2008 | Aoki |
| 2009/0021157 A1 | 1/2009 | Kim et al. |
| 2009/0058295 A1 | 3/2009 | Auday et al. |
| 2009/0084438 A1* | 4/2009 | den Boer et al. ............... 136/256 |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0233386 A1 | 9/2010 | Krause et al. |
| 2010/0258179 A1 | 10/2010 | Wieting |
| 2010/0267190 A1 | 10/2010 | Hakuma et al. |
| 2011/0018103 A1 | 1/2011 | Wieting |
| 2011/0020980 A1 | 1/2011 | Wieting |
| 2011/0061737 A1* | 3/2011 | Hotz et al. ............... 136/260 |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Baumann, A., et al., Photovoltaic Technology Review, presentation Dec. 6, 2004, 18 pages.

Chopra et al., "Thin-Film Solar Cells: An Overview", 2004, Progress in Photovoltaics: Research and Applications, 2004, vol. 12, pp. 69-92.

Guillen C., "CuInS2 Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

(56) References Cited

OTHER PUBLICATIONS

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Salvador, "Hole diffusion length in n-TiO2 single crystals and sintered electrodes: photoelectrochemical determination and comparative analysis," Journal of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/ Polymer Composite Doped with Tetraphenylbenzidine Single Layer Structure Light-emitting Diode", Applied Physics Letters, vol. 69, No. 3, Jul. 15, 1996, pp. 377-379.

\* cited by examiner

THERMAL PRE-TREATMENT PROCESS FOR SODA LIME GLASS SUBSTRATE FOR THIN FILM PHOTOVOLTAIC MATERIALS

CROSS-REFERENCES TO RELATED APPLICATIONS

This application claims priority to U.S. Provisional Patent Application No. 61/101,989 filed Oct. 1, 2008, commonly assigned, and incorporated by reference in its entirety herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to photovoltaic materials and manufacturing method. More particularly, the present invention provides a method and structure for fabricating a thin film solar cells on soda lime glass substrate. Merely by way of example, the present method includes a thermal treatment process of the soda lime glass substrate for manufacture of thin film photovoltaic devices, but it would be recognized that the invention may have other configurations.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. Furthermore, processing to integrate sodium containing glass substrates including overlying electrode layers with the subsequently formed photovoltaic layer is problematic, especially for large scale manufacture. These and other limitations of these conventional technologies can be found throughout the present specification and more particularly below.

BRIEF SUMMARY OF THE INVENTION

The present invention relates generally to photovoltaic materials and manufacturing method. More particularly, the present invention provides a method and structure for fabricating a thin film solar cells on soda lime glass substrate. Merely by way of example, the present method includes a thermal treatment process of the soda lime glass substrate for manufacture of thin film photovoltaic devices, but it would be recognized that the invention may have other configurations.

In a specific embodiment, the present invention provides a method for fabricating a thin film solar cell. The method includes providing a soda lime glass substrate comprising a surface region and treating the surface region with one or more cleaning process including an aqueous solution to remove one or more contaminants and/or particulates. The method further includes forming a lower electrode layer comprising molybdenum overlying the surface region. Additionally, the method includes performing a thermal treatment process on the soda lime glass substrate comprising the lower electrode layer to remove any residual water species such that there is substantially less than a monolayer of water species on the soda lime glass substrate and the overlying lower electrode layer. The thermal treatment process changes a temperature of the soda lime glass substrate from a first temperature to a second temperature to pre-heat the soda lime glass substrate comprising the lower electrode layer and maintains the second temperature less than about 90 Degrees Celsius. The method further includes transferring the soda lime glass substrate, which has been preheated, to a deposition chamber. Furthermore, the method includes forming a layer of photovoltaic material overlying the lower electrode layer within the deposition chamber. Moreover, the method includes forming a first zinc oxide layer overlying the layer of photovoltaic material.

In another specific embodiment, the present invention provides a method for fabricating a thin film solar cell. The method includes providing a soda lime glass substrate comprising a surface region and treating the surface region with one or more cleaning process including an aqueous solution to remove one or more contaminants and/or particulates. The method further includes forming a lower electrode layer comprising molybdenum overlying the surface region. Additionally, the method includes performing a thermal treatment process to reduce any residual water species to substantially less than a monolayer of water species overlying the lower electrode layer after the thermal treatment process. The thermal treatment process changes a temperature of the soda lime glass substrate from a first temperature to a second temperature to pre-heat the soda lime glass substrate comprising the lower electrode layer. Furthermore, the method includes transferring the soda lime glass substrate, which has been preheated, to a deposition chamber. Moreover, the method includes forming a layer of photovoltaic material overlying the lower electrode layer within the deposition chamber.

Many benefits can be achieved by applying the embodiments of the present invention. Particularly, a thermal treatment process serves an important step for preparing a soda lime glass substrate for growing copper based chalcopyrite structured high efficiency photovoltaic absorber layer. The present invention provides an efficient way using a plurality of in-chamber disposed infrared heaters to directly heat the work piece including the soda lime glass substrate and an overlying patterned lower electrode layer. The method simplifies the system design can be easily implemented into a batch system for large scale manufacture with reduced cost. Of course, there can be other variations, modifications, and alternatives.

These and other benefits may be described throughout the present specification and more particularly below.

DETAILED DESCRIPTION OF THE INVENTION

The present invention relates generally to photovoltaic materials and manufacturing method. More particularly, the present invention provides a method and structure for fabricating a thin film solar cells on soda lime glass substrate. Merely by way of example, the present method includes a thermal treatment process of the soda lime glass substrate for manufacture of thin film photovoltaic devices, but it would be recognized that the invention may have other configurations.

Figure 1:
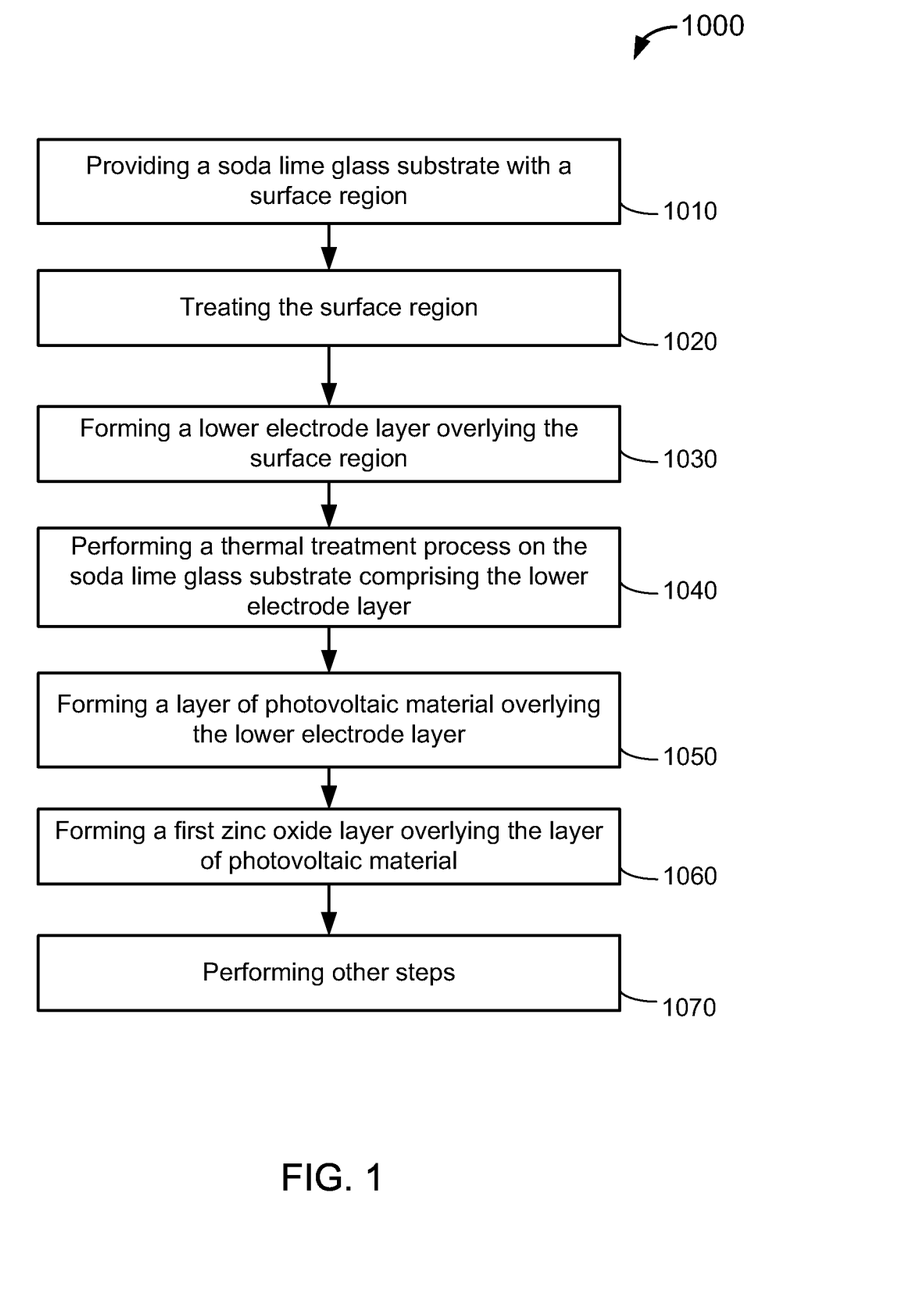
FIG. 1 is a simplified flowchart illustrating a method of fabricating a thin film solar cell according to an embodiment of the present invention.

FIG. 1 is a simplified flowchart illustrating a method of fabricating a thin film solar cell according to an embodiment of the present invention. The method 1000 includes the following processes:

1. Process 1010 for providing a soda lime glass substrate with a surface region;
2. Process 1020 for treating the surface region;
3. Process 1030 for forming a lower electrode layer overlying the surface region;
4. Process 1040 for performing a thermal treatment process on the soda lime glass substrate comprising the lower electrode layer;
5. Process 1050 for forming a layer of photovoltaic material overlying the lower electrode layer;
6. Process 1060 for forming a first zinc oxide layer overlying the layer of photovoltaic material;
7. Process 1070 for performing other steps.

The above sequence of processes provides a method of treating the soda lime glass substrate for manufacture of thin film solar cells according to an embodiment of the present invention. In a specific embodiment, the method includes performing a surface treatment and one or more thermal treatment processes on the soda lime glass substrate. Other alternatives can also be provided where processes are added, one or more processes are removed, or one or more processes are provided in a different sequence without departing from the scope of the claims herein. For example, a barrier layer may be formed before the lower electrode layer is formed. More functional layers with different material compositions can be inserted between the layer of photovoltaic material and first zinc oxide layer, and so on.

Figure 2:
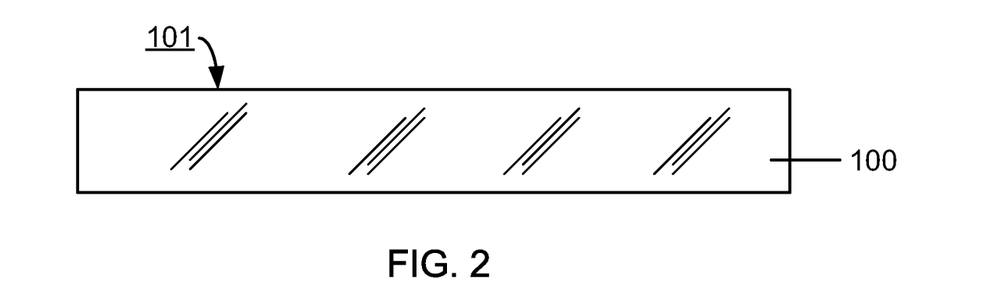
FIGS. 2-10 are schematic diagrams illustrating a method comprising a series of processes and structures for fabricating a thin film solar cell according to certain embodiments of the present invention.

At Process 1010, a soda lime glass substrate is provided. FIG. 2 is a simplified diagram illustrating a soda lime glass substrate provided for fabricating a thin film photovoltaic cell according to an embodiment of the present invention. As shown, the soda lime glass substrate 100 including a surface region 101 is provided. The soda lime glass has been widely used as window glass. One important reason for choosing the soda lime glass as substrate for forming thin film photovoltaic cells other than simple economical concern is a positive influence from alkaline ions (e.g., Na+) contained therein on the grain growth of high efficiency thin film photovoltaic materials. For example, polycrystalline chalcopyrite semiconductor films of CuIn(Ga)Se2 or CuInSe2 materials can be formed on soda lime glass substrates with coarse grain sizes of 1 microns or larger so that high photovoltaic current can be collected to achieve high efficiencies of near 17% or above with these chalcopyrite films.

Figure 3:
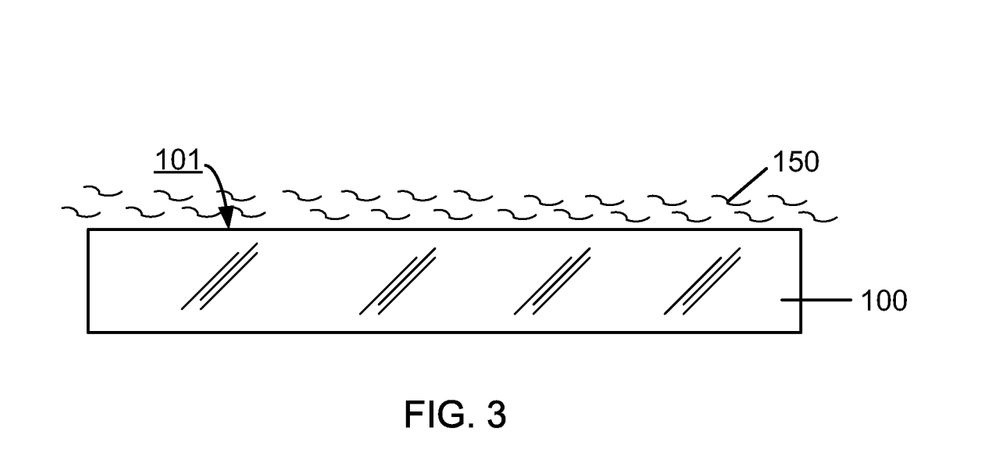

At Process 1020, the method 1000 includes a surface treatment process for treating the surface region of the soda lime glass substrate. As shown in FIG. 3, the surface region 101 of the soda lime glass substrate 100 is subjected to the treatment process 150. In one embodiment, the treatment process 150 is a washing process carried out by rinsing with an aqueous solution or directly soaking into it. For example, the aqueous solution can be a water based solution of about 0.15% of acid containing potassium dichromate, sulfuric acid, or even less amount of hydrochloric acid with controlled PH-value. The soda lime glass substrates were left then for 20 minutes under ultrasonic duty in isopropyl alcohol, then washed in deionized water, and finally dried by blowing with dry air or dry nitrogen. The surface treatment process substantially cleans the surface region 101 by removing surface contaminants, grease, dirt, particulates, and other undesired materials.

Figure 4:
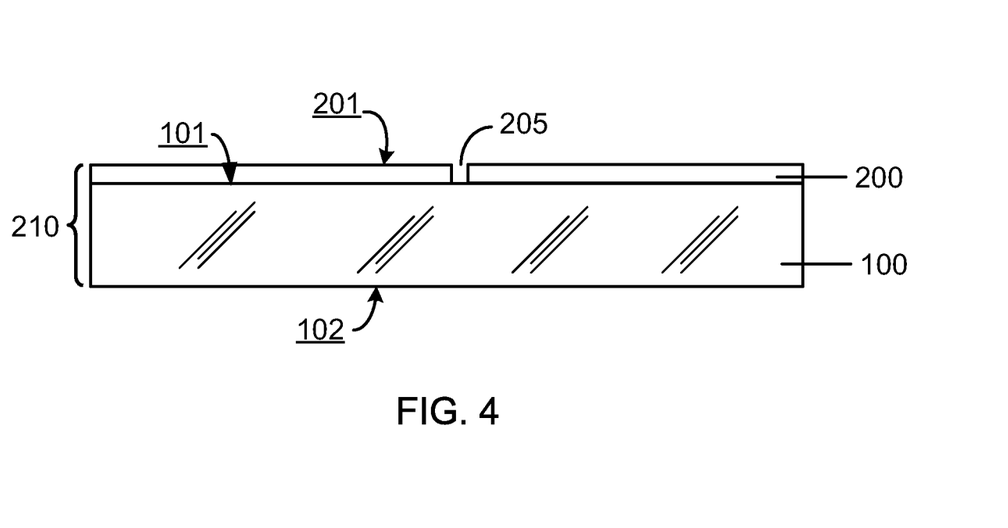

At Process 1030, a lower electrode layer is formed overlying the surface region of the soda lime glass substrate. This process is illustrated by FIG. 4, where as shown, the lower electrode layer 200 is formed overlying the surface region 101 of the soda lime glass substrate 100. The lower electrode layer 200 is used to serve a back electrode for a thin film photovoltaic cell to be formed in subsequent processes. Here "lower" is used for the current example of forming a thin film on substrate where the thin film is to become a bottom solar cell. "Lower" electrode corresponds to an "upper" or "front" electrode if located on top of a window layer. As shown in FIG. 4, the lower electrode layer 200 is formed on the surface region 101 which is on the front side of the soda lime glass substrate 100, while the backside 102 is a blank surface. When the soda lime glass substrate 100 is used as "superstrate" in an application for a top solar cell, the lower or upper electrodes can be disposed in the opposite way. In particular, either the lower or upper electrode layer can be optically transparent. The lower electrode layer is preferably made of molybdenum material with thickness ranging from 0.5 to 1 microns. In other examples, transparent conductive oxide can be used as the material for upper electrode layer.

In an implementation, the formation of the lower electrode layer can be achieved using a series of processes within a large scale batch system. The series of processes at least include one or more deposition processes, such as sputtering, plating, evaporation, plasma deposition, and the like. For example, an AC sputtering technique is used to deposit a bi-layer molybdenum materials respectively with different stress characteristics formed at different chamber pressures. More details can be found in U.S. Patent Application No. 61/101,646, commonly assigned to Stion Corporation and fully incorporated by reference herein. Additionally, the series of processes also include a patterning process. One option is to use laser patterning in which a laser beam with well controlled beam energy, pulse rate, and beam profile is utilized to ablate molybdenum layer to make one or more patterns. Shown as an example, the lower electrode layer 200 includes a pattern 205 is formed overlying the soda lime glass substrate 100. As a result, an work piece 210 including the patterned lower electrode layer 200 overlying the soda lime glass substrate 100 is formed. Furthermore, the series of processes may include a cleaning process to remove certain berm structures or other particulates generated during the patterning process. The cleaning process may involve a use of one or more mechanical brush devices and use DI water to rinse the whole soda lime glass substrate 100 including the patterned lower electrode layer 200, followed by air knife blowing. More details about the patterning process and subsequent cleaning process can be found in U.S. Patent Application No. 61/101,650, commonly assigned to Stion Corporation and fully incorporated by reference herein.

Figure 5:
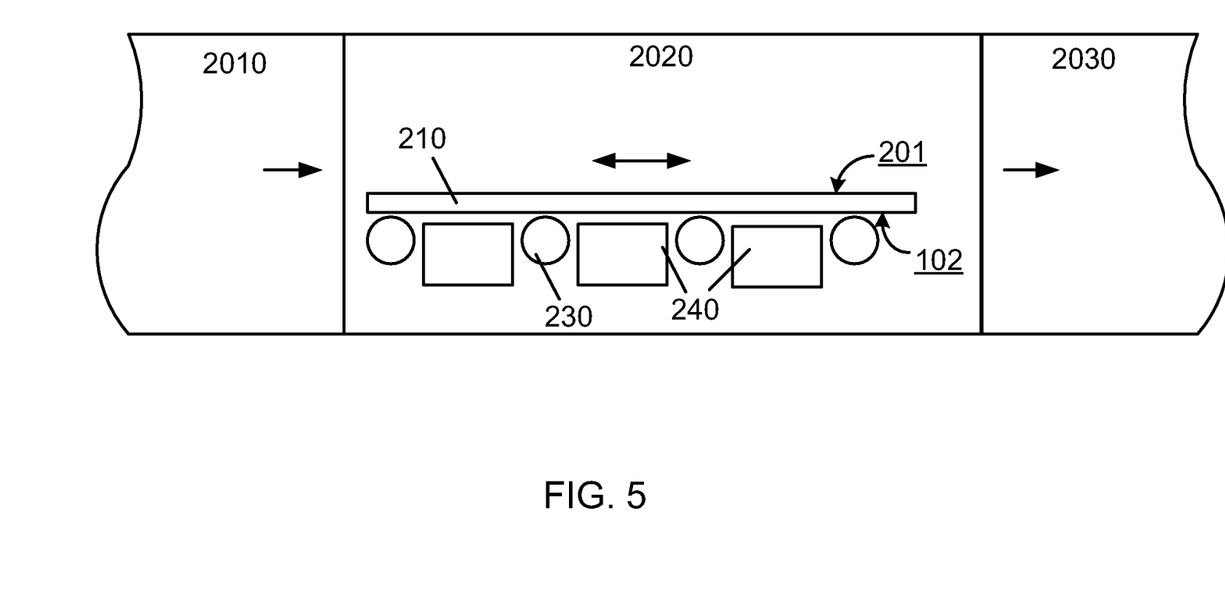

In the next process (referring to FIG. 1), the method 1000 includes performing a thermal treatment process 1040 on the work piece, e.g., the soda lime glass substrate comprising the lower electrode layer. This process is intended for preparing the work piece for subsequent thin film growth processes on the soda lime glass substrate. This process is illustrated by FIG. 5. As shown, a work piece 210 is transferred out of cleaning station 2010 and into a thermal treatment station 2020. In an example, the work piece 210 with its backside 102 seating over a plurality of rollers 230 is rolled into the thermal treatment station 2020. The rollers 230 are configured to move the work piece back and forth as desired during the thermal treatment process 1040. Additionally, a plurality of heaters 240 can be disposed near the work piece 210 seated over the rollers 230. In one example shown in FIG. 5, the heaters 240 are positioned to provide heat to the work piece 210 from the backside 102.

In an implementation, each of the plurality of heaters 240 is an infrared heater that is easy to control and adjust power through an electric supply. For example, each infrared heater can heat nearby air to about 170 degrees Celsius, causing the temperature of the soda lime glass substrate above to change from a first temperature (initially near room temperature) to a second temperature. The thermal treatment process 1040 removes any water species on the work piece 210. The soda lime glass substrate is pre-heated or sequentially heated to a temperature that is controlled to be less than 90 degrees Celsius. Depending on applications, in particular, with different placement of the heaters 240 relative to the work piece 210, the electric supply can be adjusted to produce suitable heat supply to soda lime glass substrate for a proper time period. In one example, the infrared heaters 240 are adjusted to maintain a desired temperature (less than 90 degree Celsius) of the soda lime glass substrate for 250 seconds. In another example, the infrared heaters 240 are adjusted to maintain a desired temperature (less than 90 degree Celsius) of the soda lime glass substrate for 200 seconds. In yet another example, the infrared heaters 240 are adjusted to maintain a desired temperature (less than 90 degree Celsius) of the soda lime glass substrate for 60 seconds.

In particular for the configuration shown in FIG. 5, the thermal treatment process 1040 is intended to substantially remove water species overlying both the surface 201 of the lower electrode layer 200 and the backside 102 of the soda lime glass substrate 100. For example, the work piece 210 should be first preheated for a period of time to allow the temperature to be raised to about a desired value (less than 90 degrees Celsius) and then the heating is continued for another period of time, as described in the previous paragraph. In another example, during the preheating and/or continuous heating period, the work piece 210 can be moved back and forth by controlling the rollers 230, allowing more uniform heating through the whole area of the work piece 210. In an embodiment, the thermal treatment process 1040 as described results in dissolving water species from any exposed surface of the work piece 210. In particular within a proper heating period, any water species should be removed from the surface 201 of the lower electrode layer 200 and the backside 102 of the soda lime glass substrate. Embodiments of the invention show that the thermal treatment process results in a substantially less than a monolayer of water species overlying the lower electrode layer. Furthermore, as mentioned any exposed surface of the work piece 210 may include region of pattern 205 or regions of glass side edges. Followed by the thermal treatment process, the prepared work piece 210, characterized by substantially less than a monolayer of water species overlying a patterned lower electrode layer on soda lime glass substrate, is transferred to a deposition chamber 2030 (as shown in FIG. 5).

Figure 6:
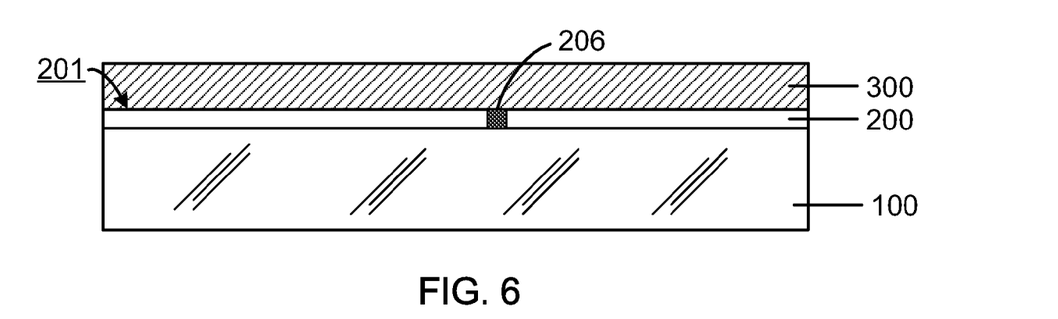

Referring to FIG. 1, the method 1000 includes a next process 1050 of forming a layer of photovoltaic material overlying the lower electrode layer. This process is illustrated by FIG. 6, which is a schematic diagram showing a layer of photovoltaic material formed overlying the lower electrode layer according to an embodiment of the present invention. As shown, a layer of photovoltaic material 300 is formed overlying the lower electrode layer 200. In a specific embodiment, the process 1050 includes at least one or more deposition processes and one or more additional thermal treatment processes. In an example, the one or more depositing processes include forming one or more precursor layers using one or more sputtering processes. For example, the one or more precursor layers include copper, indium, gallium species and may further include sodium species. In an implementation, the one or more sputtering processes are performed within the deposition chamber 2030. In another implementation, the one or more sputtering processes are carried out in different compartments of the chamber 2030. Furthermore, process 1050 would include performing one or more additional thermal treatment processes to transform the precursor layers into the layer of photovoltaic material 300. These additional thermal treatment processes may include a selenization process or sulfidazation process involving one or more chemical reactions, annealing, and/or diffusions. More details about the formation of one or more copper species based precursor layers and subsequently transformation into a polycrystalline coarse grained CIGS chalcopyrite photovoltaic absorber can be found in U.S. Patent Application No. 61/101,638, commonly assigned to Stion Corporation and fully incorporated by reference herein.

In an example shown in FIG. 6, the layer of photovoltaic material 300 is formed overlying the surface 201 of the lower electrode layer 200 with an embedded interconnect structure 206 located at the pattern 205 formed previously. In another specific embodiment, the layer of photovoltaic material 300 comprises a copper indium gallium diselenide material, or copper indium (gallium) disulfide material with coarse grain chalcopyrite structure including a certain amount of sodium doping concentration. Large grain sizes as large as a few microns are obtained with CIGS chalcopyrite structure accord to embodiments of the present invention to form the layer of photovoltaic. Therefore, high photo current can be expected and subsequently high efficiency is expected for the CIGS based thin film solar cells formed thereafter. Although the above has been generally described in terms of a specific structure for CIS and/or CIGS thin film solar cells, other specific CIS and/or CIGS configurations can also be used, such as those noted in U.S. Pat. No. 4,612,411 and U.S. Pat. No. 4,611,091, which are hereby incorporated by reference herein.

Figure 7:
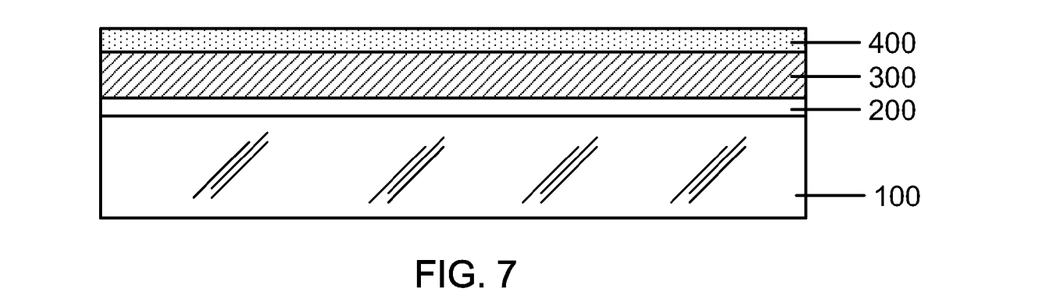

Referring to FIG. 1 again, the method 1000 further includes a process (1060) of forming an upper electrode layer over the layer of photovoltaic material. This process is illustrated by FIG. 7, which is a schematic diagram showing a process for fabricating a thin film solar cell according to an embodiment of the present invention. As shown, the upper electrode layer 400 is a first zinc oxide layer which is transparent conductive oxide or TCO. In a specific embodiment, the upper electrode layer 400 can be a zinc oxide layer formed using a metalorganic chemical vapor deposition (MOCVD) technique within a batch system. The formed first zinc oxide layer by MOCVD is a rough layer, which can diffuse the incoming light by scattering, increasing the efficiency of solar cells.

The method 1000 then can include a process 1070 for any additional step of fabricating a thin film photovoltaic device. For example, the process 1070 can be a process of inserting one more layers with various suitable materials between those layers formed in above processes. The process 1070 can also be a laser or mechanical patterning process for making patterns within the lower or upper electrode layers. The patterns can be filled with materials that have suitable optical and electrical properties for making interconnect structures of the thin film solar cells thereof.

Figure 8:
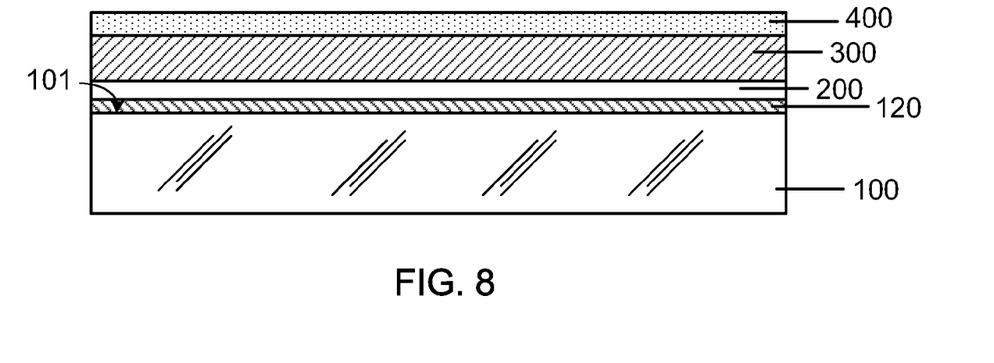

In an alternative embodiment, the method 1000 may include a process of forming a barrier layer directly onto the surface region after treatment process 1020 of the soda lime glass substrate and before the process 1030 for forming a lower electrode layer. FIG. 8 shows such a process of fabricating a thin film photovoltaic cell on a soda lime glass substrate according to an alternative embodiment of the present invention. As shown, a barrier layer 120 is inserted between the lower electrode layer 200 and the surface region 101 of the soda lime glass substrate 100. Because excessive, uncontrolled amount of sodium may reduce the grain sizes of the photovoltaic thin film grown on the soda lime glass substrate, the barrier layer 120 is applied to prevent sodium from diffusing into the upper layers, especially the layer of photovoltaic material. In one embodiment, the barrier layer 120 is a layer of silicon dioxide formed by a sputtering process, which serves as an effective sodium diffusion barrier with a thickness of only about 500 Angstroms or less. Other materials including aluminum oxide, silicon nitride, titanium nitride, titanium oxide, or zirconium oxide also can be used depending on applications.

Figure 9:
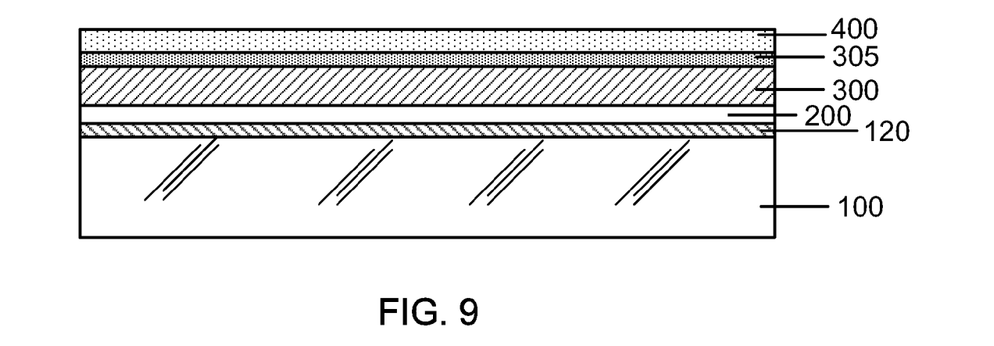

In another alternative embodiment, the method 1000 can include a process of forming a cadmium sulfide layer overlying the layer of photovoltaic material before forming the first zinc oxide layer. In particular, as shown in FIG. 9 the layer of photovoltaic material 300 is a layer of copper indium diselenide material overlying the lower electrode molybdenum layer 200. The cadmium sulfide layer 305, characterized as a wide bandgap semiconductor, is formed over the layer of copper indium diselenide material 300 to serve as a window layer for the thin film solar cell while the layer of copper indium diselenide material 300 acting as an absorber layer. In certain embodiments, the cadmium sulfide layer 305 is considered as one part of the layer of photovoltaic material which is formed using a multilayer deposition and treatment process. In one example, the cadmium sulfide layer 305 can be formed using sputtering, vacuum evaporation, or chemical bath deposition (CBD) techniques and doped with n'-type impurities for conductivity. Depending on embodiments, the window layer 305 can be selected from a group materials consisting of a cadmium sulfide (CdS), a zinc sulfide (ZnS), zinc selenium (ZnSe), zinc oxide (ZnO), zinc magnesium oxide (ZnMgO), or others.

Figure 10:
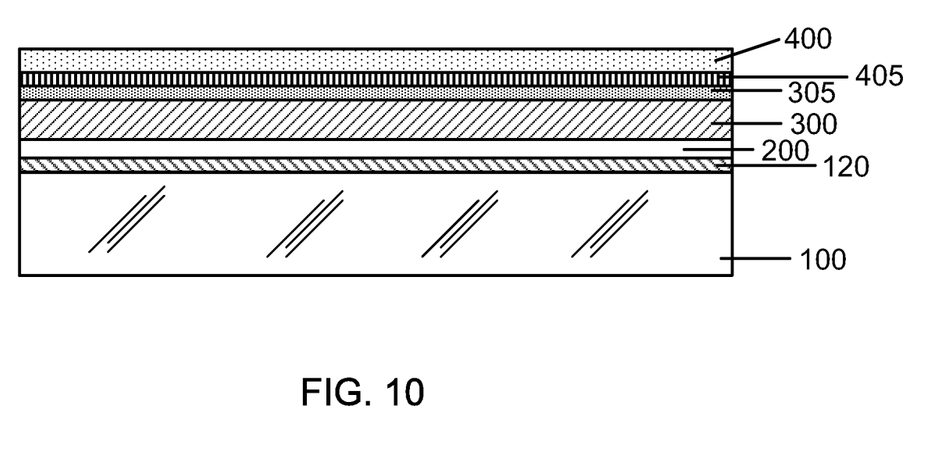

In yet another alternative embodiment, the method 1000 can include a process of forming a second zinc oxide layer before forming the first zinc oxide layer. As shown in FIG. 10 the second zinc oxide layer 405 is first formed over the layer of photovoltaic material, or in particular over the cadmium sulfide layer 305, and the first zinc oxide layer 400 is formed over the second oxide layer 405. The layer of photovoltaic material 300 is a layer of copper indium diselenide material overlying the lower electrode molybdenum layer 200. In a specific embodiment, the second zinc oxide layer 405 has a higher resistivity than the first zinc oxide layer 400. Functionally, the second zinc oxide layer 405 plays more a role of barrier/protection layer while the first zinc oxide layer 400 with lower resistivity plays more a role of conductive electrode layer. In certain embodiment, the second zinc oxide layer 405 is also formed using a metalorganic chemical vapor deposition (MOCVD) technique within a batch system.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a thin film solar cell, the method comprising:

providing a soda lime glass substrate having a surface region;

treating the surface region with an aqueous solution containing an acid to remove contaminants;

subsequently forming a lower electrode layer including a conductive metal over the surface region;

performing a thermal treatment process on the soda lime glass substrate and the lower electrode layer to remove residual water species such that there is substantially less than a monolayer of water species on the soda lime glass substrate and the overlying lower electrode layer, wherein the thermal treatment process comprises heating the soda lime glass substrate to less than 90 degrees Celsius;

transferring the soda lime glass substrate while still in a heated state to a deposition chamber;

forming a layer of photovoltaic material over the lower electrode layer within the deposition chamber; and forming a first zinc oxide layer over the layer of photovoltaic material.

2. The method of claim 1 wherein the step of performing the thermal treatment process comprises directing radiation from a plurality of infrared heaters from a backside of the soda lime glass substrate.

3. The method of claim 2 wherein the changed temperature of the soda lime glass is maintained for less than about 250 seconds.

4. The method of claim 2 wherein the performing the thermal treatment process comprises rolling the soda lime glass substrate back and forth above the plurality of infrared heaters.

5. The method of claim 1 wherein the layer of photovoltaic material comprises one or more precursor layers of an absorber material.

6. The method of claim 5 wherein the one or more precursor layers comprises at least a copper layer and/or an indium layer.

7. The method of claim 1 further comprising forming a barrier layer overlying the surface region before forming the lower electrode layer overlying the barrier layer, such that the lower electrode does not contact the surface region.

8. The method of claim 7 wherein the barrier layer comprises a silicon dioxide layer of about 500 Angstroms or less for keeping sodium species within the soda lime glass substrate during the thermal treatment process.

9. The method of claim 1 wherein the step of treating the surface region with an aqueous solution containing an acid comprises using a water based solution of about 0.15% of acid containing potassium dichromate or sulfuric acid.

10. The method of claim 1 wherein the step of treating the surface region with an aqueous solution containing an acid comprises using a water based solution of less than 0.15% of acid containing hydrochloric acid.

11. A method for fabricating a thin film solar cell comprising:

providing a soda lime glass substrate having an upper surface and a lower surface;

treating both the upper and lower surfaces with an aqueous solution containing about 0.15% acid;

rinsing the treated substrate in isopropyl alcohol;

subsequently rinsing the substrate in deionized water;

forming a molybdenum electrode layer over the treated and rinsed upper surface region;

heating the lower surface of the substrate so the substrate is raised to an elevated temperature of less than 90 degrees Celsius;

while maintaining the elevated temperature, transferring the substrate to a deposition chamber;

using the deposition chamber, forming photovoltaic material over the electrode layer; and forming a zinc oxide layer over the layer of photovoltaic material.

* * * * *